United States Patent
Pinkerton et al.

(10) Patent No.: US 12,000,908 B2
(45) Date of Patent: Jun. 4, 2024

(54) MEMBRANE-BASED NANO-ELECTROMECHANICAL SYSTEMS DEVICE AND METHODS TO MAKE AND USE SAME

(71) Applicant: Clean Energy Labs, LLC, Austin, TX (US)

(72) Inventors: Alexander Joseph Pinkerton, Austin, TX (US); Joseph F. Pinkerton, Austin, TX (US)

(73) Assignee: Brane Audio, LLC, Austin, TX (US)

(*) Notice: Subject to any disclaimer, the term of this patent is extended or adjusted under 35 U.S.C. 154(b) by 243 days.

(21) Appl. No.: 17/419,209

(22) PCT Filed: Dec. 27, 2019

(86) PCT No.: PCT/US2019/068787
§ 371 (c)(1),
(2) Date: Jun. 28, 2021

(87) PCT Pub. No.: WO2020/140060
PCT Pub. Date: Jul. 2, 2020

(65) Prior Publication Data
US 2022/0349961 A1   Nov. 3, 2022

Related U.S. Application Data

(60) Provisional application No. 62/785,551, filed on Dec. 27, 2018.

(51) Int. Cl.
*G01R 33/02*       (2006.01)
*B81C 1/00*        (2006.01)
*G01R 33/028*      (2006.01)

(52) U.S. Cl.
CPC ...... *G01R 33/0286* (2013.01); *B81C 1/00158* (2013.01); *B81B 2203/0127* (2013.01); *B81B 2203/0315* (2013.01)

(58) Field of Classification Search
CPC ............... G01R 33/0286; G01R 33/00; G01R 33/0035; G01R 33/0023; G01R 33/0017;
(Continued)

(56) References Cited

U.S. PATENT DOCUMENTS 9,515,580 B2     12/2016  Pinkerton et al.
2015/0180372 A1*  6/2015  Pinkerton ............ G02B 7/1821
                                                    977/774
(Continued)

FOREIGN PATENT DOCUMENTS

WO      2020140060 A1    7/2020

OTHER PUBLICATIONS

Patent Cooperation Treaty, International Preliminary Report on Patentability for PCT/US2019/068787 dated Feb. 23, 2021; 33 pages.

*Primary Examiner* — Jermele M Hollington
*Assistant Examiner* — Taqi R Nasir
(74) *Attorney, Agent, or Firm* — Dickinson Wright PLLC; Ross Spencer Garsson

(57) ABSTRACT

Nano-electromechanical systems (NEMS) devices that utilize thin electrically conductive membranes, which can be, for example, graphene membranes. The membrane-based NEMS devices can be used as sensors, electrical relays, adjustable angle mirror devices, variable impedance devices, and devices performing other functions. The NEMS devices have a serpentine shape arrangement of the electrically conductive membrane. The electrically conductive membrane can be controllably wicked down on the edge of the oxide cavity to increase sensitivity of the NEMS device.

22 Claims, 6 Drawing Sheets

(58) Field of Classification Search
CPC ............ G01R 31/3191; B81C 1/00158; B81B 2203/0127; B81B 2203/0315; G01B 7/004; G01C 17/38; G06F 3/017; G06F 3/0346; G06F 3/012
See application file for complete search history.

(56) References Cited

U.S. PATENT DOCUMENTS

2018/0201511 A1* 7/2018 Ruhl ..................... G01R 33/07
2018/0261415 A1* 9/2018 Koul ..................... H01P 1/2005

* cited by examiner

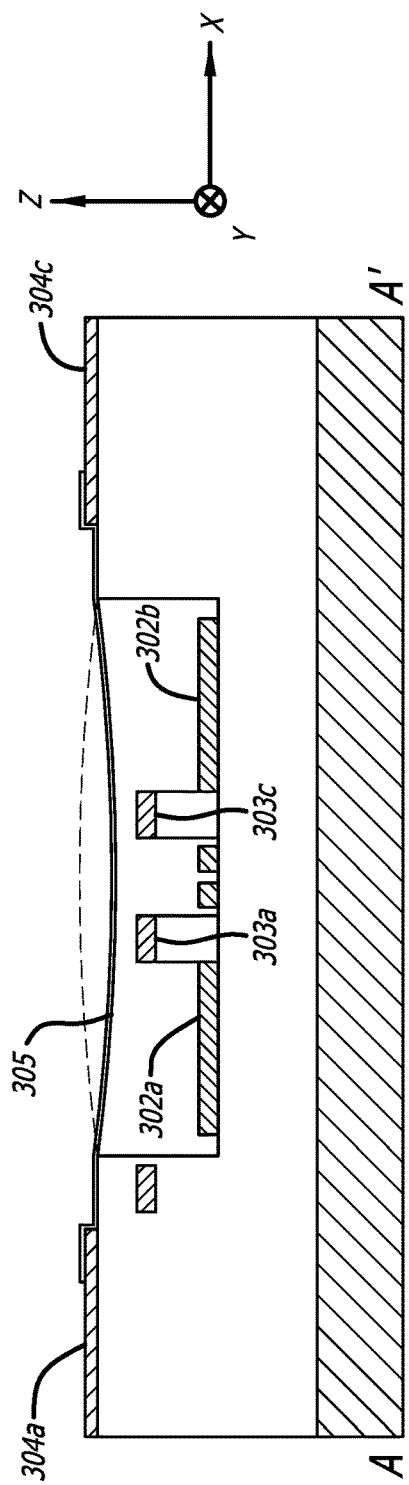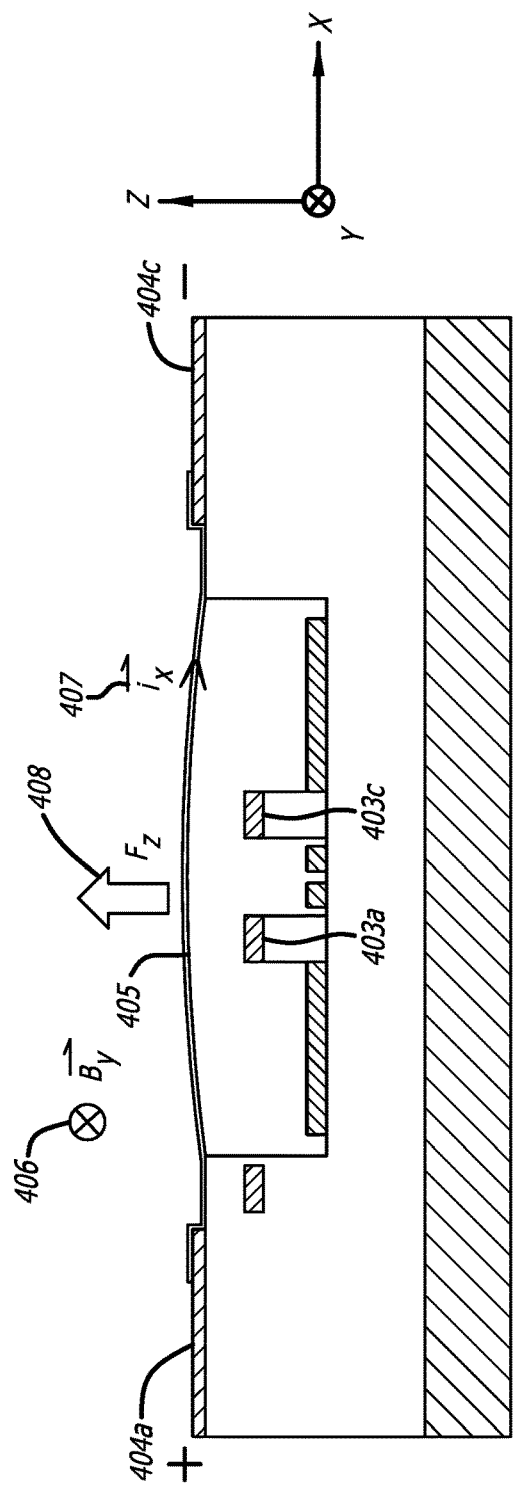

MEMBRANE-BASED NANO-ELECTROMECHANICAL SYSTEMS DEVICE AND METHODS TO MAKE AND USE SAME

RELATED PATENT APPLICATIONS

This application is a 35. U.S.C § 371 national application of PCT Application NO. PCT/US19/68787, filed on Dec. 27, 2019, entitled "Membrane-Based Nano-Electromechanical Systems Device And Methods To Make And Use Same", which claims priority to U.S. Provisional Patent Application Ser. No. 62/785,551, filed Dec. 27, 2018, to Joseph F. Pinkerton, entitled "Membrane-Based Nano-Electromechanical Systems Device And Methods to Make And Use Same." These applications are commonly assigned to the Assignee of the present invention and are hereby incorporated herein by reference in their entirety for all purpose.

TECHNICAL FIELD

The present invention relates to membrane-based nano-electromechanical systems (NEMS) devices and methods to make and use such devices.

BACKGROUND

A class of small devices exists that are referred to as micro-electromechanical systems (MEMS). Each major dimension of a MEMS device is generally on the order of 1-100 microns (thus "micro"). MEMS devices typically range in size from 20 μm to 1 mm. The devices often include a central unit that processes data and several components that interact with the outside environment, such as sensors. The usage of MEMS devices has dramatically increased over the past several years as companies have integrated MEMS chips into consumer products, such as cell phones and computers.

Such uses include: as sensors, electrical relays, adjustable-angle mirror devices, variable impedance devices, and devices that perform other functions (such as transducers and actuators).

The types of commercial applications include:

Gyroscopes and accelerometers, such as the gyroscope/accelerometer chips used in cell phones to re-orient the screen when turned 90 degrees and allow users to interact with cell phones in more complex ways. MEMS devices are used as gyroscopes in automobiles and other devices to detect yaw, pitch, and roll. This can be used to deploy a roll over bar or to trigger dynamic stability control. MEMS devices are also used as accelerometers in game controllers, personal media players, and digital cameras. They are also used in personal computers to park the hard disc head, when free-fall is detected, to prevent damage and data loss. MEMS devices have also been used in accelerometers in cars, such as to deploy airbags during a collision.

Microphones, such as microphones in cell phones, head sets, and lap top computers.

Magnetometers, such as magnetometers to perform the compass function in cell phones.

Sensors, such as pressure sensors in car tire pressure sensors or blood pressure sensors. Further, for example, biosensors and chemosensors used in medical- and health-related technologies.

Inkjet printers, such as inkjet printers that use piezoelectrics or thermal bubble ejection to deposit ink on paper.

Displays, such as used in digital micro-mirror devices in projectors or such as for interferometric modulator displays.

Optical switching, such as used for switching technology and alignment for data communication.

Fluid flow, such as for micro-cooling systems.

Although MEMS devices are relatively small, MEMS devices are technologically complex structures that cost more per unit wafer area than CMOS chips to fabricate.

U.S. Pat. No. 9,515,580, entitled "Membrane-Based Nano-Electronmechanical Systems Device and Methods To Make And Use Same," issued Dec. 6, 2016 to Pinkerton et al. (the "Pinkerton '580 Patent") provides for nano-electromechanical systems (NEMS) devices that utilize thin electrically conductive membranes, which can be, for example, graphene membranes. Such membrane-based NEMS devices can be used as sensors, electrical relays, adjustable angle mirror devices, variable impedance devices, and devices performing other functions. The Pinkerton '580 Patent is hereby incorporated by reference herein in its entirety.

The Pinkerton '580 Patent discloses and teaches membrane-based NEMS devices. One exemplary devices is shown in FIGS. 1A-1B (which are FIGS. 3A-3B, respectively, in the Pinkerton '580 Patent). FIG. 1A depicts an overhead view of a 4-spoke membrane-based NEMS device 300. Lower traces 302a, 302b, 302c, and 302d can be used as gates/drivers, middle traces 303a, 303b, 303c, and 303d can be used as drains/sensors, and upper traces 304a, 304b, 304c, and 304d can be used as sources. The membrane-based NEMS device 300 also includes an electrically conductive membrane 305 (graphene). The membrane-based NEMS device 300 can have drain/sensor trace widths (such as the widths of middle traces 303a and 303c) that are each unique so that tilting motion of a cylinder (such as a metal cylinder) (not shown in FIG. 3) can be differentiated from planer motion in the x-y plane.

Cross-section A-A', as given in FIG. 1A, is shown by the side view depicted in FIG. 1B. FIG. 1B shows how the electrically conductive membrane 305 (graphene) can be deflected (shown by solid and dashed lines) with the lower traces (302a and 302b). Maintaining the smallest possible gap between the electrically conductive membrane 305 (graphene) and lower traces (traces 303a and 303c as shown in FIG. 3B) dramatically increases the sensitivity of the membrane-based NEMS device 300 because capacitance is inversely proportional to this gap.

FIG. 2 (which is FIG. 4 in the Pinkerton '580 Patent) depicts a membrane-based NEMS device 400 from the same cross-sectional side view as shown for membrane-based NEMS device 300 in FIG. 1B. In FIG. 2, the membrane-based NEMS device 400 is a membrane-based NEMS sensor that is sensing an external magnetic field B 406 along the y-axis. Current (i 407) from upper trace 404a, through the electrically conductive membrane 405 (graphene) and to upper trace 404c interacts with magnetic field B 406 to create a force F 408 along the z-axis. This force F 408 deflects the electrically conductive membrane 405 (e.g., graphene) in the direction of the z-axis (upward as illustrated in FIG. 2), increasing the gap between the electrically conductive membrane 405 and middle traces (such as middle traces 403a and 403c), which in turn lowers the capacitance between the upper traces (such as upper traces 404a and 404c) and the middle traces (such as middle traces 403a and 403c). This reduction in capacitance is related to the strength and direction of the external magnetic field B 406; therefore, the membrane-based NEMS device 400 is a magnetic field sensor (a membrane-based NEMS magnetic field sensor).

To increase the sensitivity of such a membrane-based NEMS magnetic field sensor 400, current (i 407) can be pulsed through the electrically conductive membrane 405 (graphene) at an electrical frequency equal to the mechanical resonant frequency of the electrically conductive membrane 405 (e.g., graphene), thus increasing the deflection of the electrically conductive membrane 405 (e.g., graphene) and related capacitance change.

The membrane-based NEMS device 400 can operate in air or vacuum, but will be more sensitive in vacuum because the current and the quality factor of the electrically conductive membrane 405 (e.g., graphene) resonance can be higher.

FIG. 3 (which is FIG. 5 in the Pinkerton '580 Patent) shows how magnetic field B 507 can be measured along the z-axis (perpendicular to the plane of the electrically conductive membrane 505) with a metal cylinder 506 (or other material) mounted to the electrically conductive membrane 505. Similar to as shown in FIG. 2, the force from the AC current (i 508) is along the y-axis. Again, the electrical frequency can be optimally set to the mechanical frequency of the electrically conductive membrane 505 and the metal cylinder 506. The CM of metal cylinder 506 will oscillate through the y-z plane, and this oscillation will cause corresponding changes in capacitance between middle trances and the upper traces (which are related to the strength of the magnetic field B 507).

Nano-electromechanical systems (NEMS) devices that utilize thin, electrically conductive membranes (referred to herein as "membrane-based NEMS devices"). The thin membrane is generally on the order of one nanometer. The thin membrane can be made of graphene; however, other electrically conductive membranes (such as reduced graphene oxide) or semiconductor-based membranes (such as molybdenum disulfide) can be used.

The membrane-based NEMS devices can be used as sensors ("membrane-based NEMS sensors"), electrical relays ("membrane-based NEMS relays"), adjustable-angle mirror devices ("membrane-based NEMS adjustable-angle mirrors"), variable impedance devices ("membrane-based NEMS variable impedance devices"), and devices performing other functions.

SUMMARY OF THE INVENTION

Applicant has discovered improved NEMS devices based upon a serpentine shape arrangement of the electrically conductive membrane (e.g., graphene). Such serpentine shape arrangement can be used for improved membrane-based NEMS devices, membrane-based NEMS sensors, membrane-based NEMS relays, membrane-based NEMS adjustable-angle mirrors, and membrane-based NEMS variable impedance devices. In some embodiments, the electrically conductive membrane (i.e., the graphene) is controllably "wicked down" on the edge of the oxide cavity to increase the sensitivity of the device.

For instance, this serpentine shape arrangement provides an improved magnetic flux density (B) sensor, including to sense magnetic flux density (B) signals in all three directions (a three axis sensor). Moreover, this design can also be used to approximately cancel self-generated magnetic fields by the NEMS device (created by currents flowing through the electrically conductive membrane (e.g., graphene)) because the serpentine arrangement can provide an equal number of oppositely directed currents in each of the NEMS. This will prevent the device from being overwhelmed by its own magnetic fields.

In general, in one aspect, the invention features a nano-electromechanical systems device including an electrically conductive membrane trough chip section that is oriented along a first plane. The electrically conductive membrane trough section includes a thin, electrically conductive membrane in a serpentine shape arrangement having a first end and a second end. The electrically conductive membrane trough section further includes a substrate having a non-conductive layer oriented parallel to the first plane. The non-conductive layer includes a plurality of cavities exposing one or more metal traces on the substrate. The thin, electrically conductive membrane is on the non-conductive layer parallel to the first plane such that, due to the serpentine shape arrangement, the thin, electrically conductive membrane bounds the plurality of cavities and provides for a plurality of portions of the thin, electrically conductive membrane to face the one or more metal traces in the plurality of cavities. The electrically conductive membrane trough section further includes a first connector electrically connected to the first end of the serpentine shape arrangement. The electrically conductive membrane trough section further includes a second connector electrically connected to the second end of the serpentine shape arrangement, such that current is operable to flow through the thin, electrically conductive membrane between the first connector and the second connector causing each of the portions of the thin, electrically conductive membrane facing the plurality of cavities to deflect in a direction perpendicular to the first plane in the presence of a magnetic field.

Implementations of the invention can include one or more of the following features:

The thin, electrically conductive membrane can have a thickness of approximately one nm.

The thin, electrically conductive membrane can have a thickness between 1 nm and 25 nm.

The thin, electrically conductive membrane can be selected from a group consisting of graphene, graphene oxide, graphene/graphene oxide composites, and electrically conductive polymers.

The thin, electrically conductive membrane can be one layer of graphene.

The thin, electrically conductive membrane can include multiple layers of graphene.

The thin, electrically conductive membrane can include PDMS coated with an electrically conductive material.

The plurality of cavities can be arranged in a plurality of rows.

The plurality of rows can include a first portion of the plurality of rows and a second portion of the plurality of rows. The deflection of the portions of the thin, electrically conductive membrane in a direction perpendicular to the first plane can include a first set of deflections in which the portions of the thin, electrically conductive membrane facing the first portions of plurality of rows deflect in a direction toward the substrate and the portions of the thin, electrically conductive membrane facing the second portions of rows deflect in a direction away from the substrate. The deflection of the portions of the thin, electrically conductive membrane in a direction perpendicular to the first plane can include a second set of deflections in in which the portions of the thin, electrically conductive membrane facing the first portions of plurality of rows deflect in the direction away from the substrate and the portions of the thin, electrically conductive membrane facing the second portions of rows deflect in the direction toward the substrate.

The deflections of the portions of the thin, electrically conductive membrane covering the plurality of cavities in adjacent rows in the plurality of rows can deflect in an equal magnitude and opposite direction.

The thin, electrically conductive membrane can be wicked down on the edge of each of the first plurality of cavities.

The nano-electromechanical systems device can include two electrically conductive membrane trough chip sections. The two electrically conductive membrane trough chip sections can be perpendicular to one another.

The nano-electromechanical systems device can include three electrically conductive membrane trough chip sections. The three electrically conductive membrane trough chip sections can each be perpendicular to one another.

The nano-electromechanical systems device can be selected from a group consisting of membrane-based NEMS sensors, membrane-based magnetometers, and combinations thereof.

The nano-electromechanical systems device of claim 1 can be operable to sense an alternating magnetic field signal.

The alternating magnetic field signal can be between 1 and 100 femto-tesla.

The thin, electrically conductive membrane faces the one or more metal traces in the plurality of cavities can be at a gap distance of between 5 and 50 nm.

The substrate can be a Si wafer.

The non-conductive layer can be an oxide layer.

In general, in another aspect, the invention features an apparatus that includes at least one of the above described nano-electromechanical systems devices.

Implementations of the invention can include one or more of the following features:

The apparatus can be selected from a group consisting of microphones, magnetometers, NEMS sensors, and combinations thereof.

In general, in another aspect, the invention features a method that includes selecting an apparatus that includes at least one of the above described nano-electromechanical systems devices. The method further includes utilizing the nano-electromechanical systems device in the apparatus in a use selected from a group consisting of NEMS sensors, microphones, magnetometers, and combinations thereof.

Implementations of the invention can include one or more of the following features:

The apparatus can be selected from a group consisting of microphones, magnetometers, and combinations thereof.

DESCRIPTION OF DRAWINGS

FIG. 1B (which is FIG. 3B in the Pinkerton '580 Patent) depicts a cross-sectional side view (A-A') of the membrane-based NEMS device shown in FIG. 1A.

FIG. 2 (which is FIG. 4 in the Pinkerton '580 Patent) depicts the same cross-sectional side view of the membrane-based NEMS device as shown in FIG. 1B showing the membrane-based NEMS device sensing an external magnetic field along one axis.

FIG. 6A shows half of the electrically conductive membranes (along cross-sectional side view (X-X')) deflecting in one direction, with the other half deflecting in the opposite direction. FIG. 6B shows how the electrically conductive membranes shift to the other positions when the direction of magnetic field reverses so that they each deflect the other way, thus remaining half deflected in one direction and the other half deflected in the opposite direction.

DETAILED DESCRIPTION

The present invention is a nano-electromechanical systems (NEMS) device that utilizes thin, electrically conductive membranes. The thin membrane is generally on the order of one nanometer thick while the other two dimensions are 10-500 microns in dimension.

The thin membrane can be made of graphene. Graphene membranes (also otherwise referred to as "graphene drums or troughs") have been manufactured for limited research purposes using process such as disclosed in Lee et al. Science, 2008, 321, 385-388. A graphene membrane is atomically thin. Graphene sheets—one-atom-thick two-dimensional layers of $sp^2$-bonded carbon—have a range of unique electrical, thermal and mechanical properties. Other atomically thin materials also exist that have their own unique electrical, thermal, and mechanical properties. Such atomically thin materials include graphene oxide and graphene/graphene oxide composites, such as described and discussed in commonly owned U.S. Pat. No. 8,338,728, entitled "Nanoelectromechanical Tunneling Current Switch Systems," issued Dec. 25, 2012, to Pinkerton.

While embodiments of the present invention having graphene are discussed and described herein, the thin membranes utilized in the present invention are not limited to graphene. Rather, the thin membranes can be any thin material that is sufficiently mechanically robust (such as, for example, a thin membrane of graphene oxide, a polymer such as PDMS or any combination of materials that form a sufficiently robust composite material, such as a thin membrane of graphene and graphene oxide) to span the lateral dimensions of the target substrate feature (such as micro or nano wells). Thus, the discussion of graphene is for exemplary purposes and is not intended to limit the scope of the present invention.

Furthermore, the thin membranes used in the present invention are generally a membrane that is atomically thin.

For single-layer graphene membranes, the thickness is subnanometer; membranes containing multiple graphene layers, graphene/graphene oxide composites, etc. are typically on the order of about 1 to about 25 nanometers.

The membrane-based NEMS device of the present invention can perform the same functions as a MEMS device but are much smaller (generally around 100 times smaller), lower cost, and more facile to design and fabricate.

Such membrane-based NEMS devices can be used to function as accelerometers, magnetometers, gyroscopes, resonators/clocks, thermometers, barometers, variable capacitors, electrical relays, humidity sensors, light reflectors for digital light projectors and optical switching, microphones, pressure sensors (other than microphone) and variable inductors. Unlike many MEMS, the membrane-based NEMS devices of the present invention can perform more than one of these functionalities simultaneously. Furthermore, the membrane-based NEMS devices of the present invention can also store energy and perform energy harvesting.

Figure 1A:
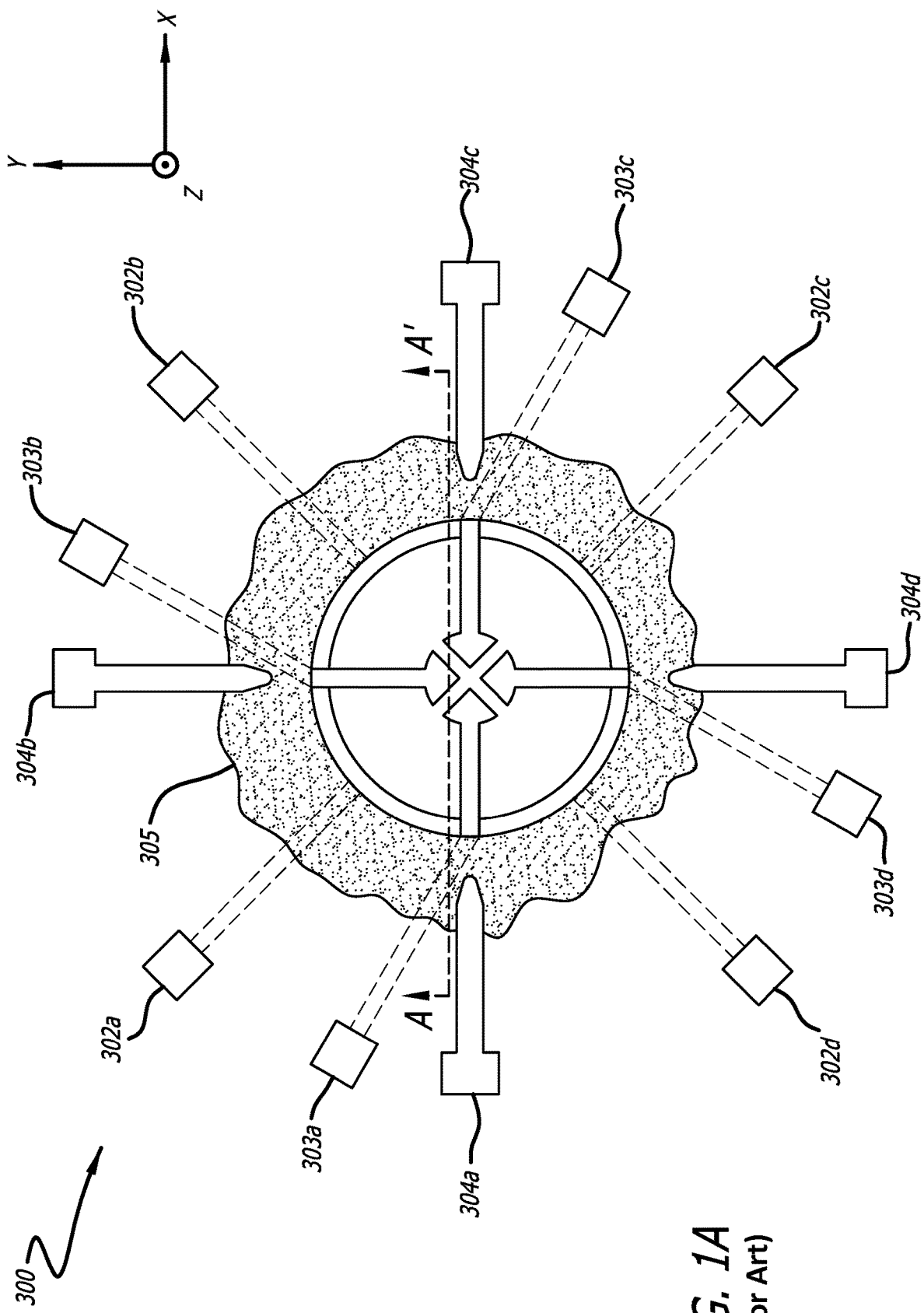
FIG. 1A (which is FIG. 3A in the Pinkerton '580 Patent) depicts an overhead view of a membrane-based NEMS device that is an embodiment of the present invention.
Figure 3:
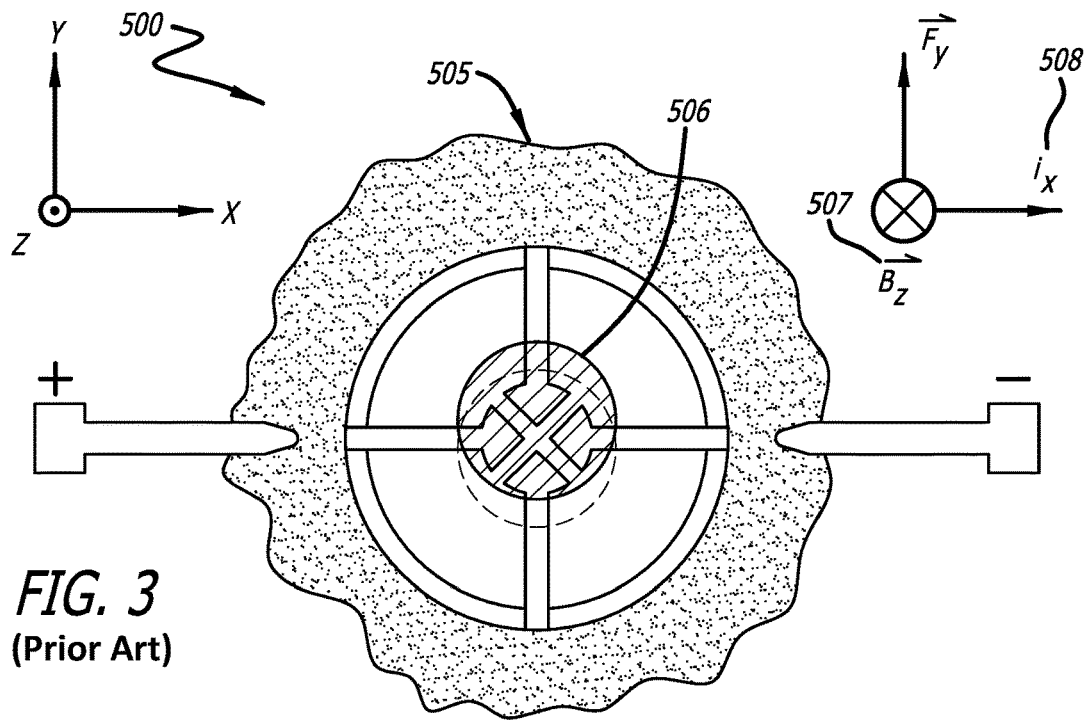
FIG. 3 (which is FIG. 5 in the Pinkerton '580 Patent) depicts an overhead view of a membrane-based NEMS device having a metal cylinder on top of the electrically conductive membrane that can be used to measure an external magnetic field along three axes.
Figure 4:
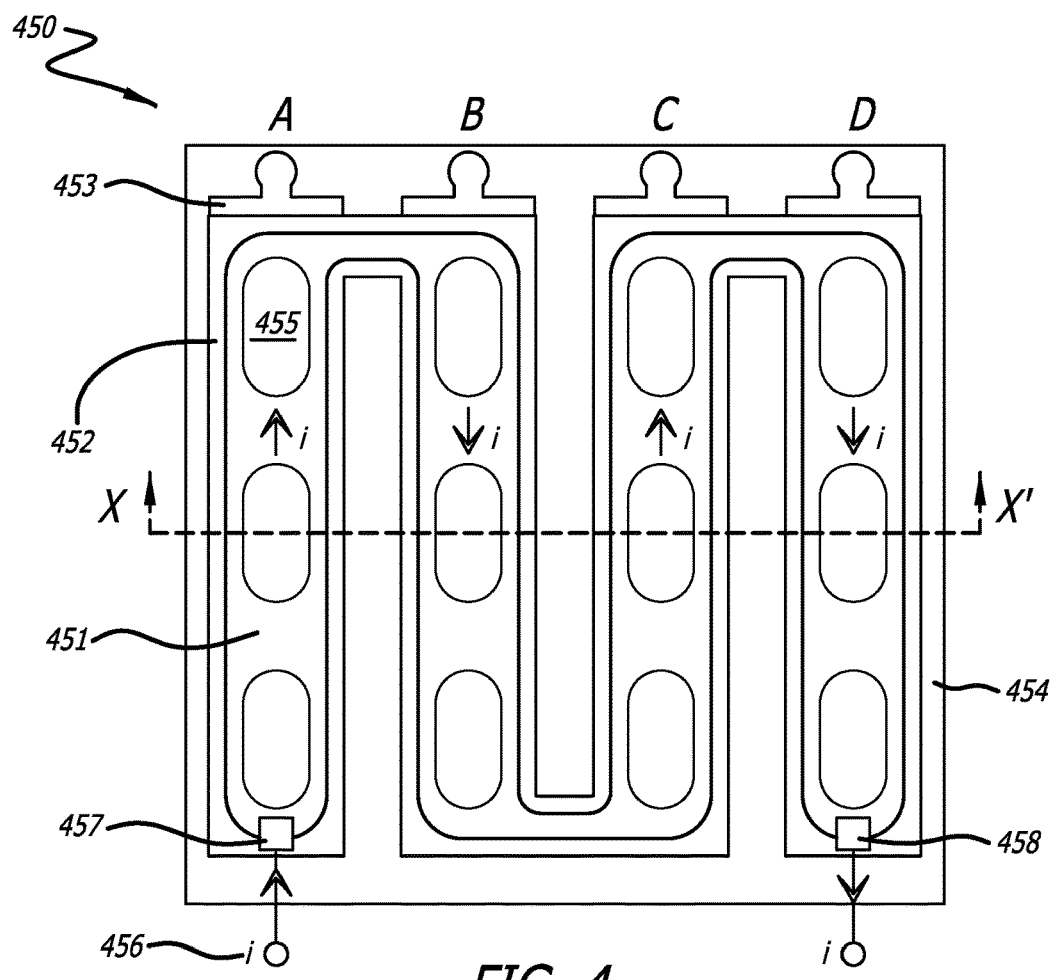
FIG. 4 depicts an illustration of a section of an NEMS device having an electrically conductive membrane in a serpentine shape arrangement. This section of the NEMS device is the electrically conductive membrane trough chip section of the NEMS device.
Figure 5:
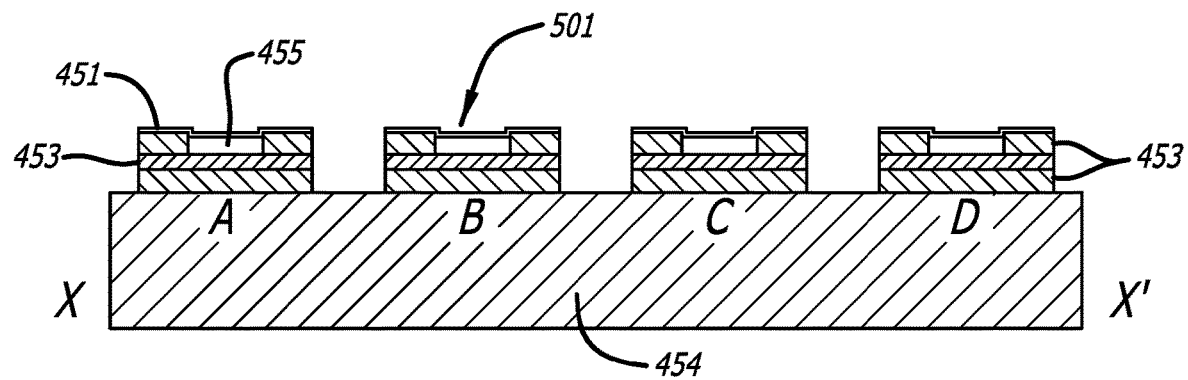
FIG. 5 depicts a cross-sectional side view (X-X') of the section of the NEMS device shown in FIG. 4.

Referring to the figures, FIG. 4 depicts a section 450 of an NEMS device having electrically conductive membrane 451 (graphene) in a serpentine shape arrangement. This section 450 is the electrically conductive membrane trough chip section of the NEMS device. The section 450 further includes oxide 452, metal trace 453 (gold), and a wafer 454 (Si wafer). There are also multiple oxide cavities 455 in which the electrically conductive material is then facing the metal 453 (without oxide 452 therebetween). FIG. 5 depicts a cross-sectional side view (X-X') of the portion of section 450 and shows cross-section views in the oxide cavities 455 in each of rows A-D.

FIG. 4 further shows that a current (i 456) can flow through membrane 450 just above metal trace 453. As shown in FIG. 4, the current (i 456) flowing from connection 457 to connection 458 results in current going in one direction along the x-axis in rows A and C, while going in the opposite direction along the x-axis in rows B and D. Should the current be reversed, this would concurrently reverse the directions of current along each of rows A-D, and thus maintain the symmetry of the current flow.

This serpentine arrangement can reduce the number of 500-2000 ohm contact resistances per suspended graphene trough to 2 (instead of 2 per trough). For a 5 mm×5 mm device this translates into a total resistance (and thus power) reduction of approximately a factor of 60.

One application of this device is to sense a faint (10-100 nano-Tesla)~ 1 MHz alternating magnetic field signal from a phone or watch with a device small enough to fit inside of an earbud. In addition to getting rid of the relatively large Bluetooth® antenna (or other wireless antenna) sticking out of current earbuds, this "antenna" consumes about 60 times less power than with standard Bluetooth® antennas or other wireless antennas. This translates to an earbud running for several days between charges instead of a few hours.

An atomically thin electrically conductive membrane, such as graphene, is the ideal material for such uses: it can handle a very high current density (the magnetic force acting on a membrane increases linearly with increasing current density), has very low mechanical inertia (it is 1-2 atoms thick) so it can move in the MHz range and has low mechanical stiffness (so it moves a relatively large amount in reaction to very small magnetic forces).

As shown in FIG. 5, the electrically conductive membrane (i.e., the graphene) "wicks down" the edge of the oxide cavity 455. (This is pointed to with arrow 501). This amount of wicking (caused by van der Waals forces) can be controlled by heating the etched metal-graphene structure (such as a copper-graphene structure) upon which the graphene is grown on (copper expands and graphene contracts when heated so the graphene/g tension increases when the Cu-g is heated) so that very small gaps (5-50 nanometers) can be achieved between the graphene and metal. The sensitivity of the magnetic field sensor is inversely proportional to the size of this gap.

For lower frequency applications, such as brain-computer interfaces (0 to 100 Hz), it is possible to modulate the current in the electrically conductive membrane (such as graphene) at the mechanical resonance frequency of the suspended electrically conductive membrane troughs to gain a factor of 100 to 1000 times in magnetic field sensor sensitivity.

Figure 6A:
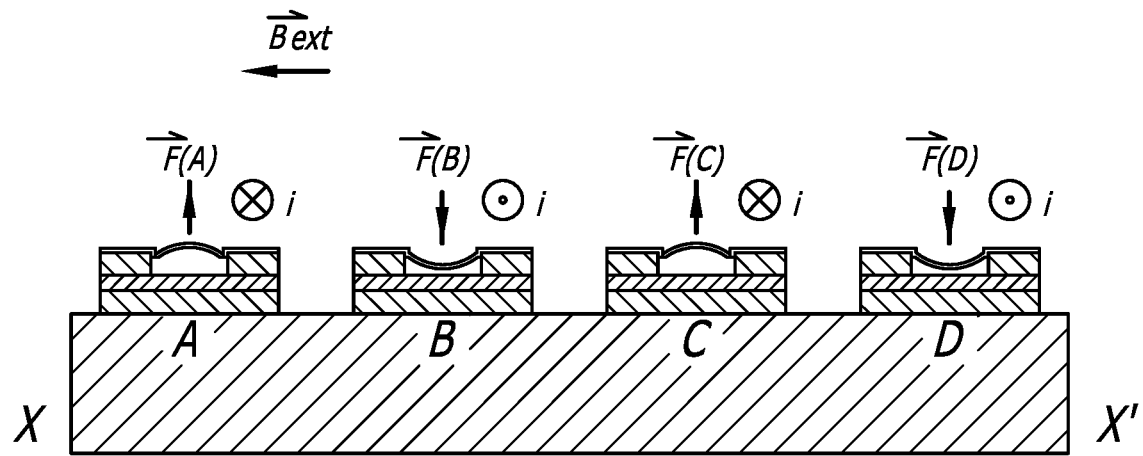
FIG. 6A-6B depict cross-sectional side views as shown in FIG. 5 showing the movement of the electrically conductive membranes using the serpentine shape arrangement, with the depicted adjacent electrically conductive membranes (along cross-sectional side view (X-X')) alternating in their direction of deflection.
Figure 6B:
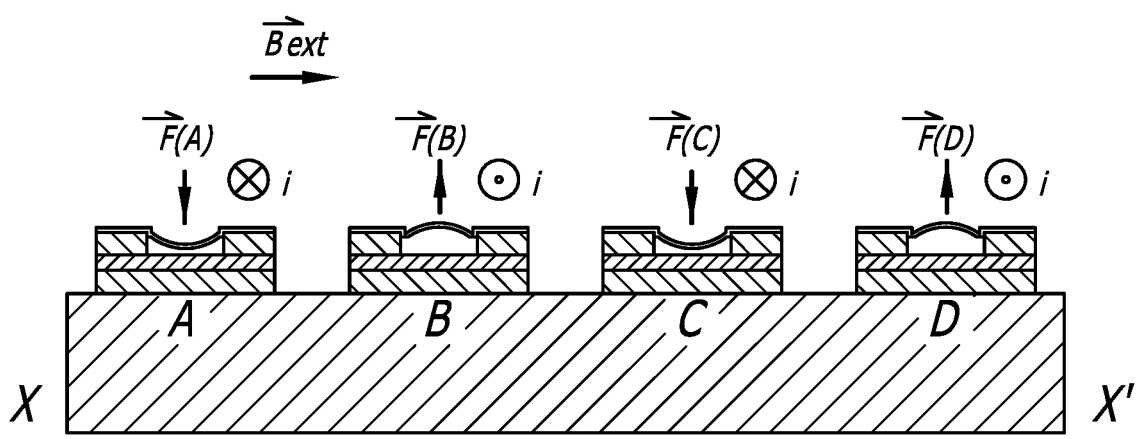

As can be seen in FIGS. 6A-6B, the capacitance of half the traces goes down (the electrically conductive membrane 451 moves away from metal trace 453, such as shown in rows A and C in FIG. 6A and rows B and D in FIG. 6B) and the other half the capacitance goes up (the electrically conductive membrane 451 moves toward the metal trace 453, such as shown in B and D in FIG. 6A and rows A and C in FIG. 6B). This creates a differential capacitance signal that increases sensitivity since one can ignore the overall capacitance and focus just on the change in capacitance.

Figure 7:
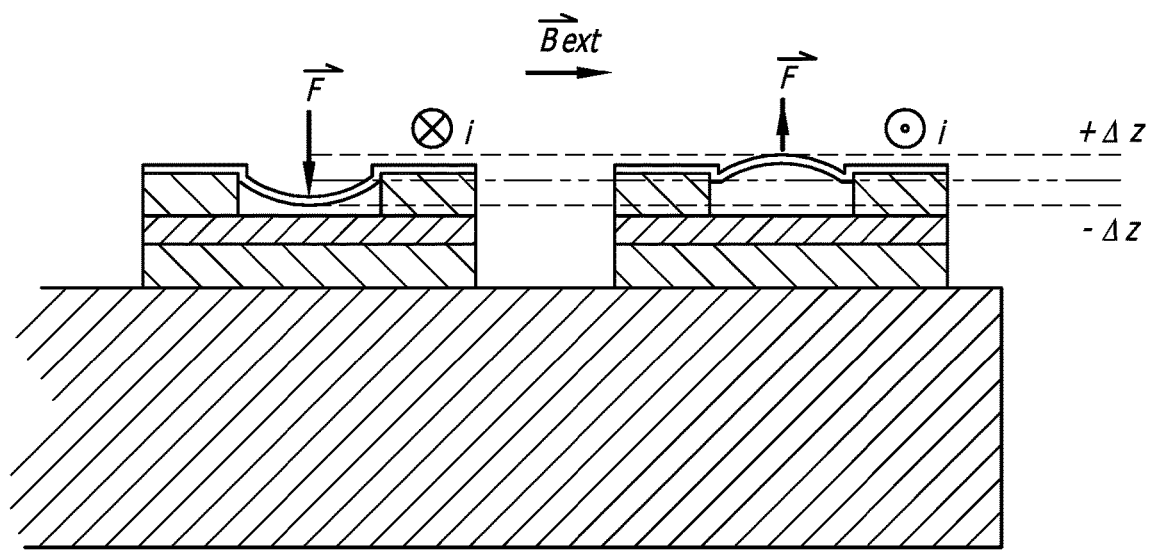
FIG. 7 shows how two adjacent graphene troughs deflect an equal amount but in opposite directions.

FIG. 7 shows that this serpentine design produces equal magnitude deflections that are directed oppositely (one membrane is deflected upward and the other membrane is deflected downward) in adjacent troughs.

Figure 8:
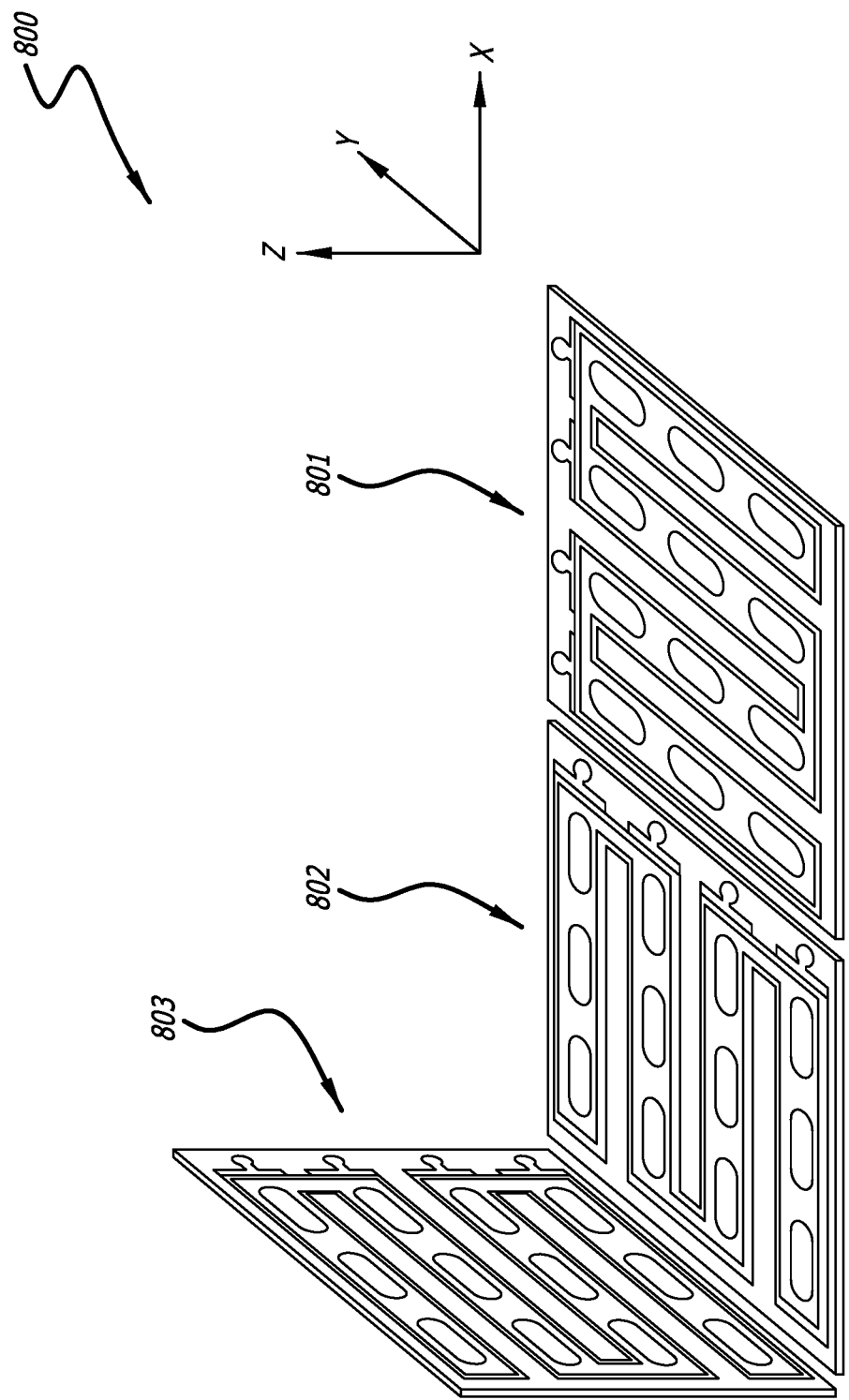
FIG. 8 shows how a combination of three electrically conductive membrane trough chip sections can be arranged in one package (or a NEMS device) to sense along all three axes (x, y and z).

FIG. 8 shows how the electrically-conductive membrane trough chip sections (sections 801-803) can be arranged to sense magnetic field signals along all three directions (as shown in x-y-z axis 800). All three chip sections 801-803 will be housed in a single plastic package. Ideally, these chip sections will operate in a partial vacuum to increase allowable current density through the electrically conductive membrane and increase the mechanical deflection due to mechanical resonance.

Orientation 801 reflects the serpentine arrangement with the oxide troughs oriented along the y-axis. This is similar to as shown in FIG. 4. Orientation 802 reflects the serpentine arrangement with the oxide troughs oriented along the x-axis. Both of these serpentine arrangements of orientations 801-802 are perpendicular to the z-axis. Orientation, 803 reflects the serpentine arrangement with the oxide troughs oriented along the y-axis and the trough chip section oriented along the z-axis. In this orientation 803, the trough chip section is perpendicular to the x-axis.

Embodiments of the present invention can be used a variety of sensors as identified above. Moreover, these can be used as neuron-computer bi-directional interfaces and as a stimulator of excitable tissue, e.g., brain tissue, spinal cord tissue, peripheral nerves, skeletal and heart muscles, etc., and can be used as an interface for functional prosthetics and brain-computer interface devices, including but not limited to, biorobotic, exoskeletons, and implantable devices.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

Amounts and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

Following long-standing patent law convention, the terms "a" and "an" mean "one or more" when used in this application, including the claims.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about" and "substantially" when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, the term "substantially perpendicular" and "substantially parallel" is meant to encompass variations of in some embodiments within ±10° of the perpendicular and parallel directions, respectively, in some embodiments within ±5° of the perpendicular and parallel directions, respectively, in some embodiments within ±1° of the perpendicular and parallel directions, respectively, and in some embodiments within ±0.5° of the perpendicular and parallel directions, respectively.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

What is claimed is:

1. A nano-electromechanical systems device comprising a magnetic field sensor that comprises an electrically conductive membrane trough chip section that is oriented along a first plane, wherein the electrically conductive membrane trough section comprises
    (a) a thin, electrically conductive membrane in a serpentine shape arrangement having a first end and a second end,
    (b) a substrate having a non-conductive layer oriented parallel to the first plane, wherein
        (i) the non-conductive layer comprises a plurality of cavities exposing one or more metal traces on the substrate,
        (ii) the thin, electrically conductive membrane is on the non-conductive layer parallel to the first plane such that, due to the serpentine shape arrangement, the thin, electrically conductive membrane bounds the plurality of cavities and provides for a plurality of portions of the thin, electrically conductive membrane to face the one or more metal traces in the plurality of cavities, and
        (iii) the thin, electrically conductive membrane is wicked down on the edge of each of the plurality of cavities;
    (c) a first connector electrically connected to the first end of the serpentine shape arrangement; and
    (d) a second connector electrically connected to the second end of the serpentine shape arrangement, such that current is operable to flow through the thin, electrically conductive membrane between the first connector and the second connector causing each of the portions of the thin, electrically conductive membrane facing the plurality of cavities to deflect in a direction perpendicular to the first plane in the presence of a magnetic field, wherein
        (i) the magnetic field sensor is operable for sensing the magnetic field based upon sensing of changes of capacitance between the membrane and the one or traces in each of the plurality of cavities due to the deflection of the membrane facing the plurality of cavities.

2. The nano-electromechanical systems device of claim 1, wherein the thin, electrically conductive membrane has a thickness of approximately one nm.

3. The nano-electromechanical systems device of claim 1, wherein the thin, electrically conductive membrane has a thickness between 1 nm and 25 nm.

4. The nano-electromechanical systems device of claim 1, wherein the thin, electrically conductive membrane is selected from a group consisting of graphene, graphene oxide, graphene/graphene oxide composites, and electrically conductive polymers.

5. The nano-electromechanical systems device of claim 1, wherein the thin, electrically conductive membrane is one layer of graphene.

6. The nano-electromechanical systems device of claim 1, wherein the thin, electrically conductive membrane comprises multiple layers of graphene.

7. The nano-electromechanical systems device of claim 1, wherein the thin, electrically conductive membrane comprises PDMS coated with an electrically conductive material.

8. The nano-electromechanical systems device of claim 1, wherein the plurality of cavities are arranged in a plurality of rows.

9. The nano-electromechanical systems device of claim 8, wherein
(a) the plurality of rows comprises a first portion of the plurality of rows and a second portion of the plurality of rows; and
(b) the deflection of the portions of the thin, electrically conductive membrane in a direction perpendicular to the first plane comprises
(i) a first set of deflections in which the portions of the thin, electrically conductive membrane facing the first portions of plurality of rows deflect in a direction toward the substrate and the portions of the thin, electrically conductive membrane facing the second portions of rows deflect in a direction away from the substrate, and
(ii) a second set of deflections in in which the portions of the thin, electrically conductive membrane facing the first portions of plurality of rows deflect in the direction away from the substrate and the portions of the thin, electrically conductive membrane facing the second portions of rows deflect in the direction toward the substrate.

10. The nano-electromechanical systems device of claim 9, wherein the deflections of the portions of the thin, electrically conductive membrane covering the plurality of cavities in adjacent rows in the plurality of rows deflect in an equal magnitude and opposite direction.

11. The nano-electromechanical systems device of claim 1, wherein
(a) the nano-electromechanical systems device comprises two electrically conductive membrane trough chip sections, and
(b) the two electrically conductive membrane trough chip sections are perpendicular to one another.

12. The nano-electromechanical systems device of claim 1, wherein
(a) the nano-electromechanical systems device comprises three electrically conductive membrane trough chip sections, and
(b) the three electrically conductive membrane trough chip sections are each perpendicular to one another.

13. The nano-electromechanical systems device of claim 1, wherein the nano-electromechanical systems device is selected from a group consisting of membrane-based NEMS sensors, membrane-based magnetometers, and combinations thereof.

14. The nano-electromechanical systems device of claim 1, wherein the nano-electromechanical systems device of claim 1 is operable to sense an alternating magnetic field signal.

15. The nano-electromechanical systems device of claim 14, wherein the alternating magnetic field signal is between 1 and 100 femto-tesla.

16. The nano-electromechanical systems device of claim 1, wherein the thin, electrically conductive membrane faces the one or more metal traces in the plurality of cavities at a gap distance of between 5 and 50 nm.

17. The nano-electromechanical systems device of claim 1, wherein the substrate is a Si wafer.

18. The nano-electromechanical systems device of claim 1, wherein the non-conductive layer is an oxide layer.

19. An apparatus comprising a nano-electromechanical systems device of claim 1.

20. The apparatus of claim 19, wherein the apparatus is selected from a group consisting of microphones, magnetometers, NEMS sensors, and combinations thereof.

21. A method comprising:
(a) selecting an apparatus comprising a nano-electromechanical systems device of claim 1; and
(b) utilizing the nano-electromechanical systems device in the apparatus in a use selected from a group consisting of NEMS sensors, microphones, magnetometers, and combinations thereof.

22. The method of claim 21, wherein the apparatus is selected from a group consisting of microphones, magnetometers, and combinations thereof.

* * * * *